(12) United States Patent
Lee et al.

(10) Patent No.: US 6,984,877 B2
(45) Date of Patent: Jan. 10, 2006

(54) BUMPED CHIP CARRIER PACKAGE USING LEAD FRAME AND METHOD FOR MANUFACTURING THE SAME

(75) Inventors: Chan-Suk Lee, Chungcheongnam-do (KR); Cheul-Joong Youn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/830,939

(22) Filed: Apr. 22, 2004

(65) Prior Publication Data

US 2005/0098861 A1   May 12, 2005

(30) Foreign Application Priority Data

Nov. 12, 2003   (KR) ...................... 10-2003-0079772

(51) Int. Cl.
  *H01L 23/495*   (2006.01)
(52) U.S. Cl. ...................... 257/666; 438/106; 438/107; 438/118; 438/121; 438/128; 29/830; 29/846; 257/E21.508; 257/E23.031; 257/E23.046; 257/E23.124
(58) Field of Classification Search ........ 257/E21.508, 257/E23.031, E23.046, E2; 438/106, 107, 438/121; 29/830, 846
  See application file for complete search history.

(56) References Cited

U.S. PATENT DOCUMENTS 6,573,121 B2   6/2003   Yoneda et al.

2003/0015780 A1   1/2003   Kang et al.
2003/0138992 A1 *   7/2003   Rokugawa et al.

FOREIGN PATENT DOCUMENTS

| KR | 1020010001160 | 1/2001 |
| KR | 2002-31881 | 5/2002 |
| KR | 1020030008616 | 1/2003 |

OTHER PUBLICATIONS

English language abstract of Korean Publication No. 1020010001160.
English language abstract of Korean Publication No. 1020030008616.
English language abstract of Korean Publication No. 2002-31881.

* cited by examiner

*Primary Examiner*—David Nelms
*Assistant Examiner*—Mai-Huong Tran
(74) *Attorney, Agent, or Firm*—Marger Johnson & McCollom, P.C.

(57) ABSTRACT

A semiconductor package such as a bumped chip carrier (BCC) package has projections extending from a lower surface of a resin encapsulant. Each projection has a concave depression formed thereon. By reflowing a solder layer, external terminals are formed to cover the projections. An interface between the terminals and the projections increases in area, relative to conventional structures, because of the concave depressions. Therefore, the adhesive strength between the terminals and the projections also increases, and, when the BCC package is mounted on a next-level circuit board through the terminals, solder joint is also improved in reliability.

11 Claims, 8 Drawing Sheets

BUMPED CHIP CARRIER PACKAGE USING LEAD FRAME AND METHOD FOR MANUFACTURING THE SAME

CROSS REFERENCE TO RELATED APPLICATIONS

This U.S. non-provisional application claims priority under 35 U.S.C. §119 to Korean Patent Application No. 2003-79772 filed Nov. 12, 2003, the contents of which are incorporated by reference.

BACKGROUND OF THE INVENTION

1. Field of the Invention

The present invention relates generally to electronic packaging technology and, more particularly, to a bumped chip carrier package using a lead frame.

2. Description of the Related Art

Like other sectors of the semiconductor industry, the electronic packaging industry strives for packages that are smaller, lighter, faster, more multi-functional, higher performance, and more reliable. A chip size package (CSP) satisfies the industry's demand for the smallest form factor, thereby allowing smaller and advanced electronic end-applications.

A typical CSP is a bumped chip carrier (BCC) package as disclosed in U.S. Pat. No. 6,573,121. As illustrated in the above patent, a conventional BCC package includes a resin package sealing a semiconductor chip, and resin projections protruding from a surface of the resin package. Furthermore, a metallic film is plated on the resin projections and electrically connected to the semiconductor chip via bond wires. The resin projections plated with the metallic film act as terminals for external connection. Since the height of the external terminals may be adjustably controlled during the manufacture, the conventional BCC package may have an advantage over other types of CSPs using solder balls as external terminals.

Unfortunately, the metallic plating film may crack due to a difference in the coefficient of thermal expansion between the metallic film and the resin projections during reliability tests such as a temperature cycling test. Another drawback of the conventional BCC package is that the wire bonding process requires a two-step ball bonding operation. Specifically, the bond wires are ball-bonded to the metallic film as well as the chip, in comparison with a general wire bonding technique composed of a stitch bonding and a ball bonding.

A technique to solve the above-discussed problems has been introduced by the Applicant, which is disclosed in U.S. Patent Publication No. 20030015780. FIG. 1 illustrates a conventional BCC package 50 disclosed in the above Publication. Referring to FIG. 1, since a solder layer 16 is formed on a lead frame 19 used as a frame for external terminals 18, the external terminals 18 may be prevented from being damaged during reliability tests. Additionally, bond wires 21 can be stitch-bonded to inner sides of the lead frame 19 used as internal terminals 14, requiring only a one-step ball bonding operation.

Such a structure, however, has a drawback that the solder layer 16 has a poor adhesive strength to the lead frame 19. Unfortunately, this may invite the lowering of solder joint reliability and may result in delamination and/or cracking between the solder layer 16 and the lead frame 19 when the BCC package 50 is mounted on a next-level circuit board through solder balls produced by reflowing the solder layer 16.

Therefore a need remains to obviate and mitigate at least some of the above-mentioned disadvantages.

SUMMARY OF THE INVENTION

The present invention provides at least a bumped chip carrier package with increased surface area between a solder layer and a lead frame over conventional chip carrier packages, resulting in reliable solder joints.

A bumped chip carrier package embodiment and a method for manufacturing a bumped chip carrier package are provided. Referring to FIGS. 3–16, bumped chip carrier package manufacturing may comprise forming a lead frame including a first surface having a chip-attaching area, a second surface opposing the first surface, a plurality of internal terminals formed on and extending from the first surface, and a plurality of concave depressions formed on and sunk below the second surface; attaching a semiconductor chip having a plurality of chip pads to the chip-attaching area of the lead frame; electrically connecting the chip pads of the semiconductor chip and the internal terminals of the lead frame, respectively, through a plurality of bond wires; forming a resin encapsulant on the first surface of the lead frame so as to at least partially cover and therefore protect the semiconductor chip, the bond wires, and the internal terminals; and forming a plurality of external terminals on and around the respective concave depressions of the lead frame by selectively forming a solder layer over the concave depressions, selectively removing the lead frame exposed outside the solder layer, and reflowing the solder layer.

In the present embodiment, the forming of the lead frame may include providing a base lead frame; forming a first photoresist pattern on a second surface of the base lead frame, the first photoresist pattern having a plurality of openings defining regions for the concave depressions; forming the concave depressions by etching the regions exposed through the openings of the base lead frame; removing the first photoresist pattern; forming a second photoresist pattern on a first surface of the base lead frame, the second photoresist pattern selectively covering regions for the internal terminals; forming the internal terminals by etching non-covered regions of the base lead frame; and removing the second photoresist pattern.

Furthermore, in the present embodiment, the forming of the external terminals may include forming a third photoresist pattern on the second surface of the lead frame, the third photoresist pattern having openings selectively exposing the concave depressions; forming a solder layer over the concave depressions by respectively filling the openings; removing the third photoresist pattern; selectively removing the lead frame exposed outside the solder layer by using the solder layer as a mask so that residual parts of the lead frame form projections that have the concave depressions thereon and are disposed underneath the solder layer; and forming the external terminals by reflowing the solder layer.

An embodiment of the present invention comprises a bumped chip carrier package with a semiconductor chip having a plurality of chip pads formed thereon; a plurality of lead frame terminals disposed around and spaced apart from the semiconductor chip, each of the lead frame terminals having an internal terminal and a projection extending from the internal terminal, each of the projections having a concave depression; a plurality of bond wires electrically connecting the chip pads and the internal terminals, respectively; a plurality of external terminals formed of a solder layer and disposed at least in part in the respective concave depressions of the projections; and a resin encapsulant covering and protecting the semiconductor chip, the bond wires, and the internal terminals.

BRIEF DESCRIPTION OF THE DRAWINGS

FIGS. 2 through 16 illustrate an embodiment of the present invention involving a process for manufacturing a bumped chip carrier package using a lead frame, wherein:

FIG. 2 illustrates a plan view of a first photoresist pattern formed on a second surface of a lead frame;

FIG. 3 illustrates a cross-sectional view taken along the line 3—3 in FIG. 2;

FIG. 4 illustrates a cross-sectional view of concave depressions formed on the second surface of the lead frame through the first photoresist pattern;

FIG. 5 illustrates a cross-sectional view of the lead frame with the concave depressions after the first photoresist pattern is removed;

FIG. 6 illustrates a cross-sectional view of a second photoresist pattern formed on a first surface of the lead frame;

FIG. 7 illustrates a cross-sectional view of internal terminals formed on the first surface of the lead frame through the second photoresist pattern;

FIG. 8 illustrates a cross-sectional view of the lead frame after the second photoresist pattern is removed;

FIG. 9 illustrates a cross-sectional view of a semiconductor chip attached to the first surface of the lead frame;

FIG. 10 illustrates a cross-sectional view of bond wires connecting the semiconductor chip and the internal terminals;

FIG. 11 illustrates a cross-sectional view of a resin encapsulant covering the first surface of the lead frame;

FIG. 12 illustrates a cross-sectional view of a third photoresist pattern formed on the second surface of the lead frame;

FIG. 13 illustrates a cross-sectional view of a solder layer formed over the concave depressions;

FIG. 14 illustrates a cross-sectional view of the solder layer after the third photoresist pattern is removed;

FIG. 15 illustrates a cross-sectional view of the lead frame selectively etched through the solder layer; and FIG. 16 illustrates a cross-sectional view of external terminals formed by reflowing the solder layer.

DETAILED DESCRIPTION OF THE INVENTION

Figure 1:
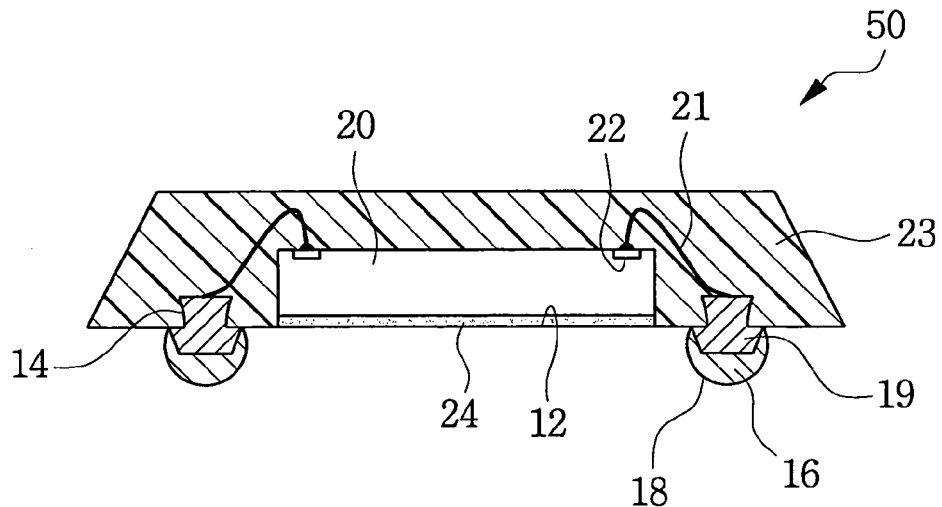
FIG. 1 is a cross-sectional view showing a conventional bumped chip carrier package using a lead frame.

The embodiments below describe aspects of the present invention with reference to the accompanying drawings. This invention may, however, be embodied in many different forms and should not be construed as limited to the following embodiments. Rather, these embodiments provide those skilled in the art with a written description.

To avoid obscuring the present invention, well-known structures and processes have not been illustrated in detail in the description. For simplicity and clarity of illustration, some elements in the drawings are not necessarily drawn to scale. For example, the dimensions of some of the elements have been exaggerated or reduced relative to other elements. In the drawings, the same reference numerals are used to designate identical and/or corresponding structural elements and features.

FIGS. 2 to 16 illustrate an embodiment process for manufacturing a bumped chip carrier (BCC) package using a lead frame in accordance with the present invention.

Figure 2:
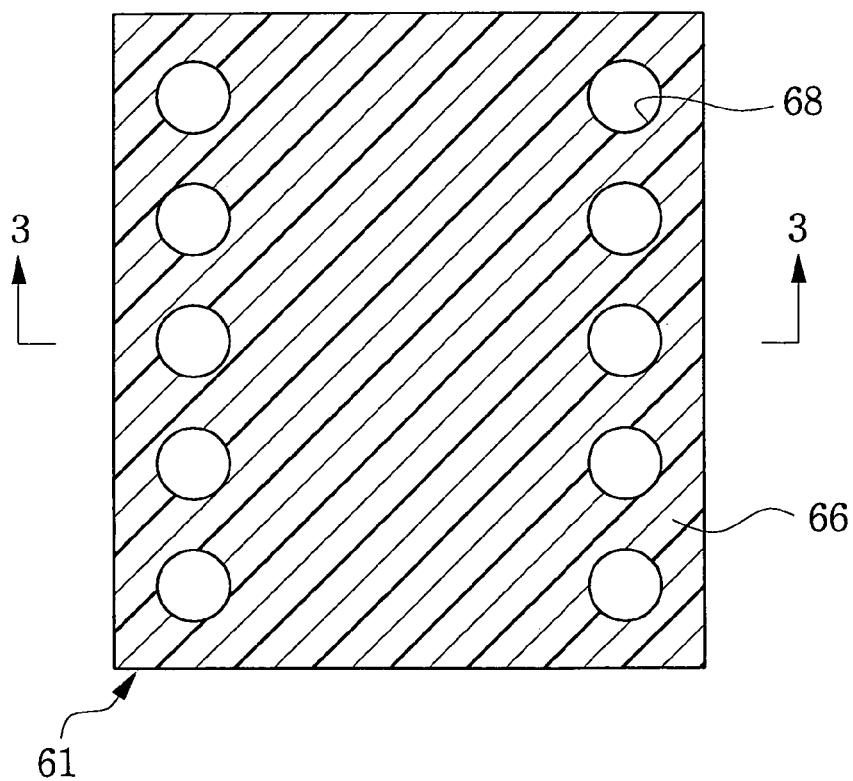
Figure 3:
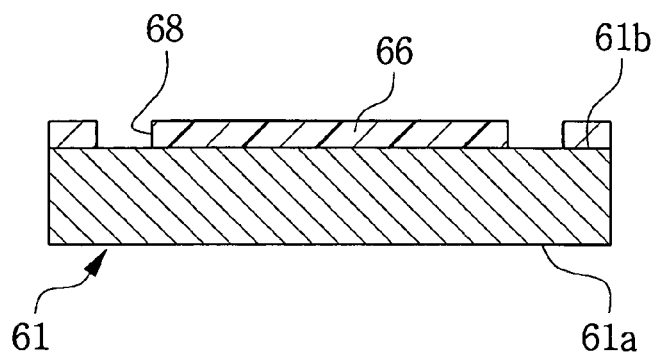

FIGS. 2 and 3 illustrate a plan view and a cross-sectional view taken along line 3—3 in FIG. 2, respectively, of a first photoresist pattern 66 formed on a base lead frame 61. The base lead frame 61 may comprise an alloy of iron (Fe) or copper (Cu), or other similar electrically conductive materials or metals. The base lead frame 61 has a first surface 61a on which a semiconductor chip is attached, and a second surface 61b opposing the first surface 61a.

To form the first photoresist pattern 66, photoresist material is coated on the second surface 61b of the base lead frame 61 and then patterned. The first photoresist pattern 66 has a plurality of openings 68 that define regions for concave depressions to be formed in the next step.

Figure 4:
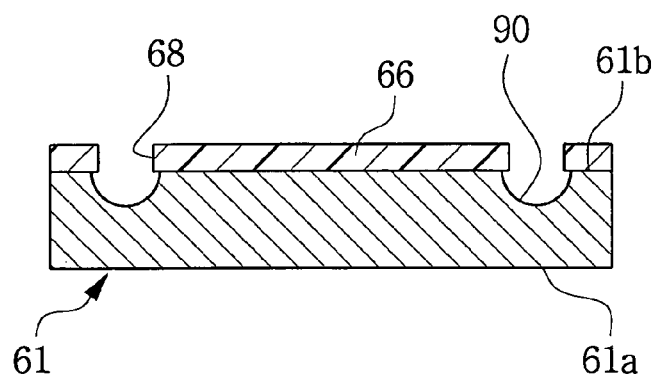

As shown in FIG. 4, the concave depressions 90, such as dimples, are formed on the second surface 61b of the base lead frame 61. To form the concave depressions 90, the regions of the base lead frame 61 exposed through the openings 68, are etched to a desired depth while the first photoresist pattern 66 is used as a mask. Though the base lead frame 61 may use a conventional wet etching technique, dry etching may alternatively be used. The concave depressions 90 may have various shapes such as hemisphere, polyhedron, cruciform, or irregulars.

Figure 5:
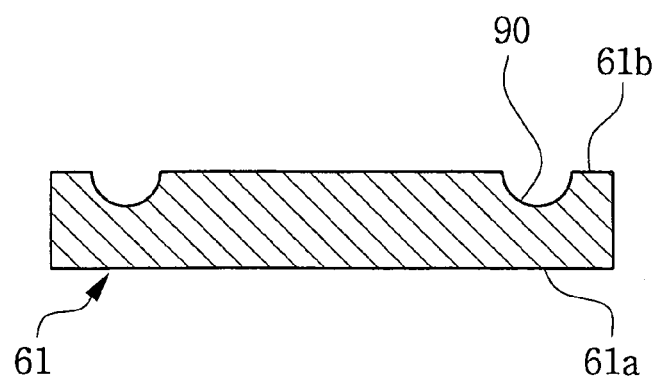

Next, as seen from FIG. 5, the first photoresist pattern 66 shown in FIG. 4 is removed from the second surface 61b of the base lead frame 61.

Figure 6:
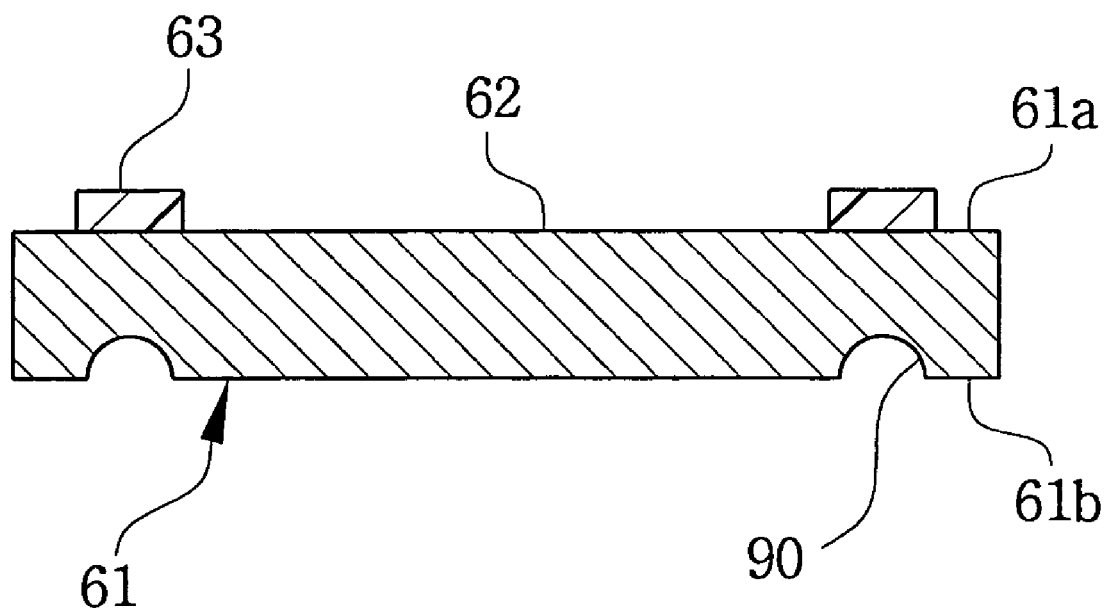

Thereafter, as shown in the present embodiment in FIG. 6, the base lead frame 61 is turned over so that the first surface 61a faces upward. Then another photoresist material is coated on the first surface 61a of the base lead frame 61 and patterned to form a second photoresist pattern 63. The second photoresist pattern 63 selectively covers specific regions, which will be used as internal terminals, of the base lead frame 61. The respective regions for the internal terminals may correspond to the concave depressions 90 formed on the second surface 61b.

Figure 7:
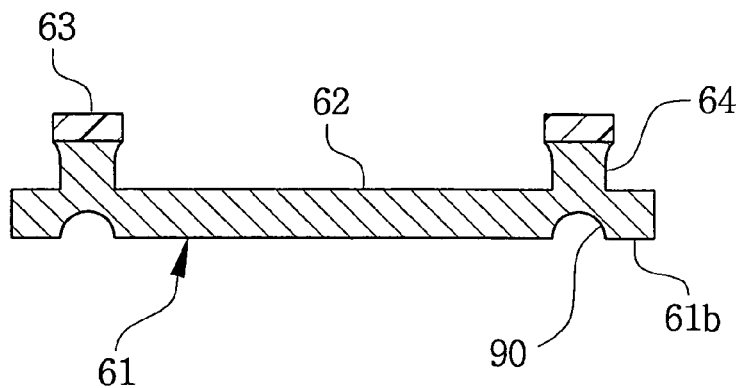

Next, as shown in FIG. 7, the internal terminals 64 are formed on the first surface 61a of the base lead frame 61 by etching non-covered regions of the base lead frame 61 to a desired depth while the second photoresist pattern 63 is used as a mask. The internal terminals 64 may be arranged in two rows spaced apart from each other.

Figure 8:
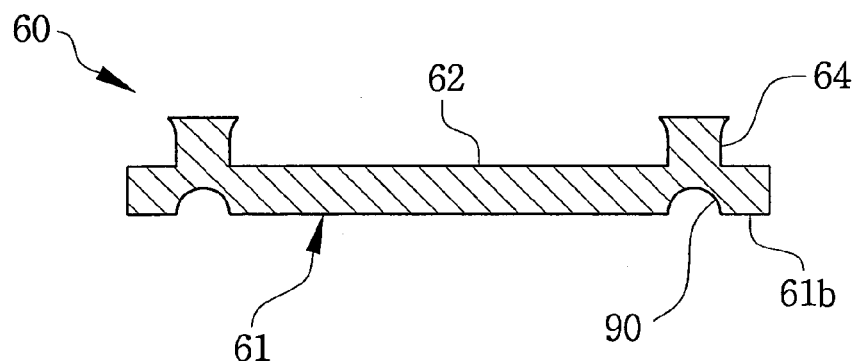

Next, the second photoresist pattern 63 is removed from the first surface 61a of the base lead frame 61 as shown in FIG. 8. As a result, a lead frame 60 is obtained including the internal terminals 64 formed on and extending from the first surface 61a and the concave depressions 90 formed on and sunk below the second surface 61b. A region 62 between the internal terminals 64 is a chip-attaching area. For good bondability of bond wires, a top surface of the internal terminal 64 may be plated with silver (Ag).

In an alternative embodiment, the internal terminals 64 may be formed earlier than the concave depressions 90.

Figure 9:
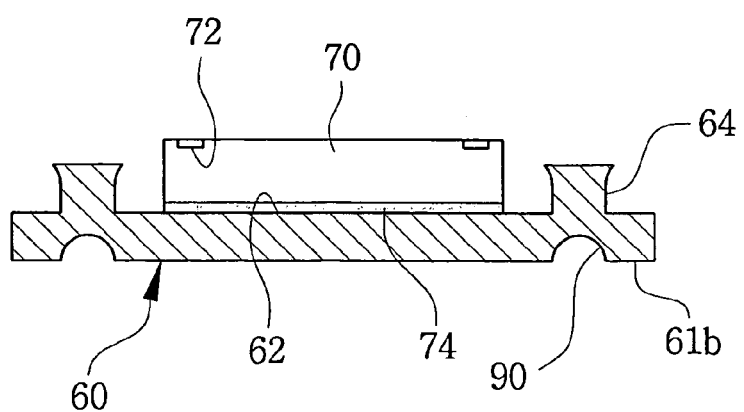

After the fabrication of the lead frame 60 is completed, as shown in FIG. 9, a semiconductor chip 70 is attached to the chip-attaching area 62 of the lead frame 60 through an adhesive 74. Therefore, the internal terminals 64 may be disposed around the semiconductor chip 70. The semiconductor chip 70 in the present embodiment has a plurality of chip pads 72. The adhesive 74 may be Ag-epoxy, solder, a double-sided adhesive tape, or other well-known adhesives.

Figure 10:
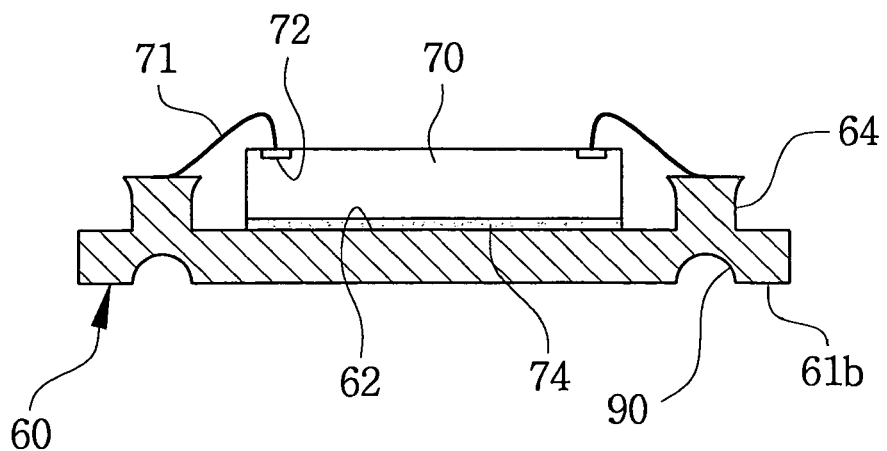

Next, as shown in FIG. 10, to make electrical connection, a plurality of bond wires 71 are bonded to the chip pads 72 of the semiconductor chip 70 and the internal terminals 64 of the lead frame 60. Exemplary bonding techniques of the bond wires 71 include typical ball-stitch bonding, reverse stitch-ball bonding, or stitch-stitch bonding.

Figure 11:
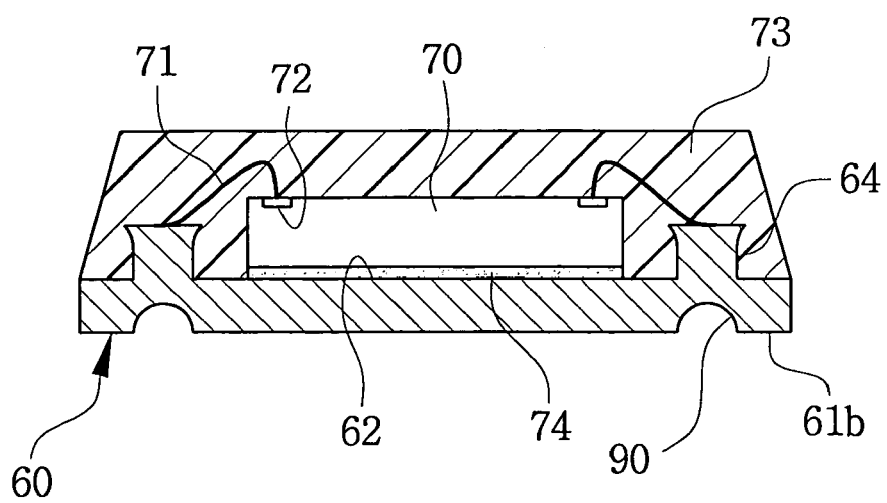

Next, as shown in FIG. 11, a resin encapsulant 73 is formed on the first surface 61a of the lead frame 60 so as to cover and protect the chip 70, the wires 71, and the internal terminals 64. Exemplary techniques to form the resin encapsulant 73 include transfer molding and potting.

Figure 12:
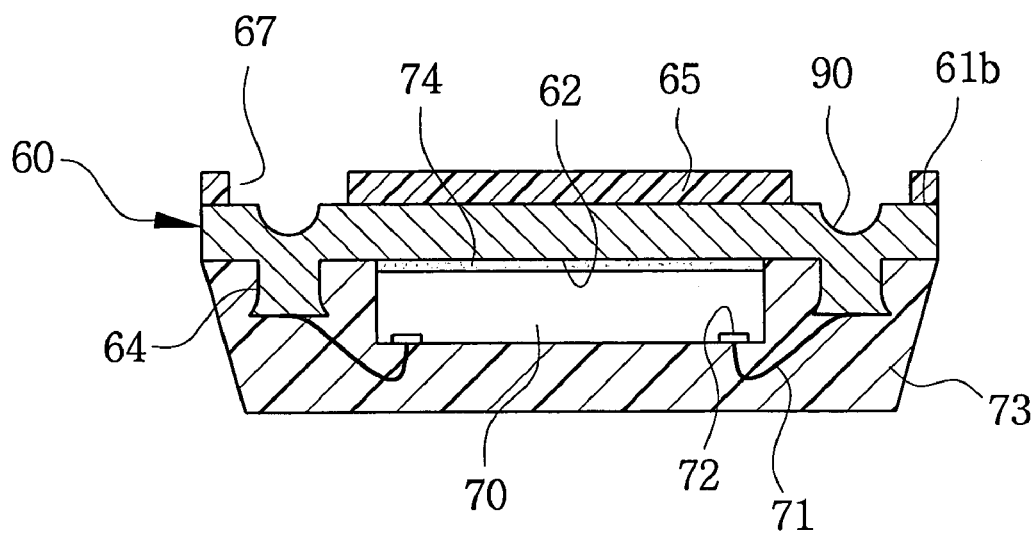

Next, as shown in FIG. 12, the lead frame 60 may be turned over so the second surface 61b faces upward. Then another photoresist material is coated on the second surface 61b of the lead frame 61 and patterned to form a third photoresist pattern 65. The third photoresist pattern 65 has openings 67 that expose the concave depressions 90. The third photoresist pattern 65 may have a thickness of about ten micrometers.

Figure 13:
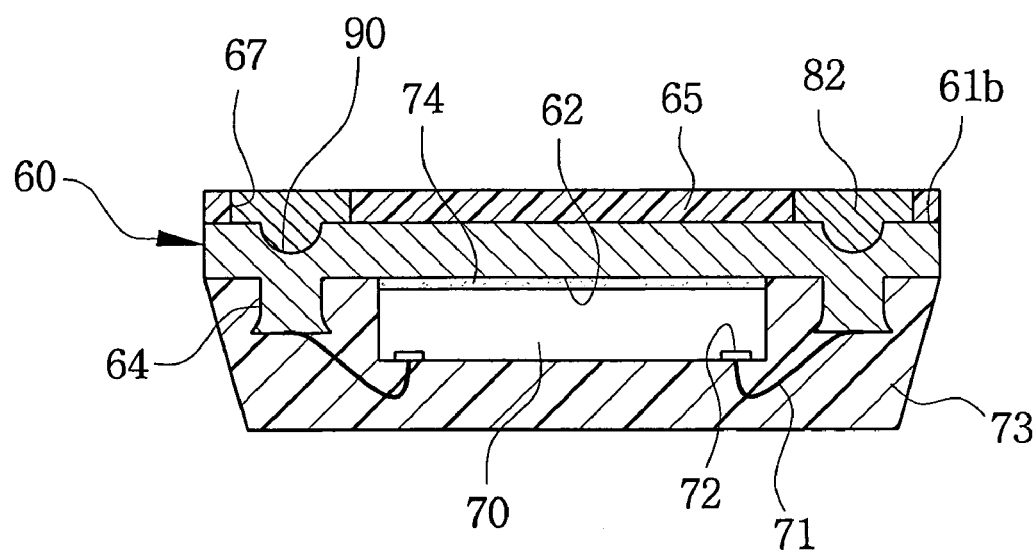

Next, as shown in FIG. 13, a solder layer 82 is formed over the concave depressions 90 by filling the openings 67. A typical electroplating technique may be used to form the solder layer 82. During an electroplating operation, the lead frame 60 is used as plating electrodes.

Figure 14:
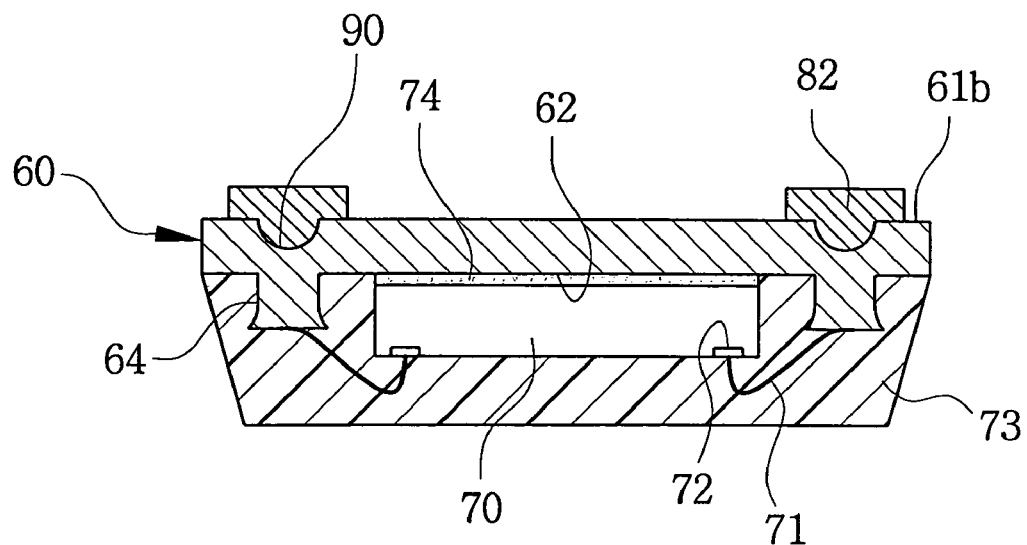
Figure 15:
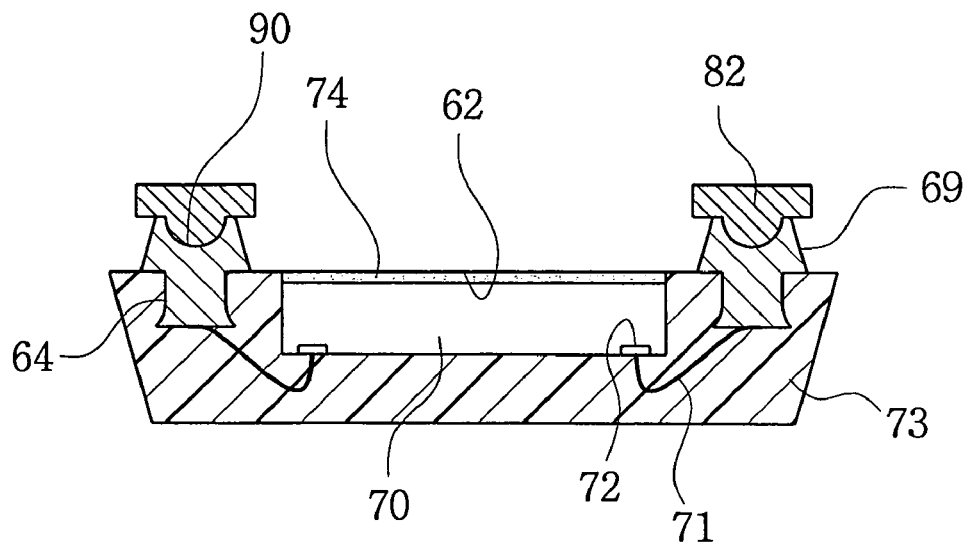

After the solder layer 82 is formed, the third photoresist pattern 65 is removed as shown in FIG. 14. Then, as shown in FIG. 15, the lead frame 60 exposed outside the solder layer 82 is etched while the solder layer 82 is used as an etch mask. By etching, exposed parts of the lead frame are removed, and therefore residual parts of the lead frame form projections 69 that have concave depressions 90 and are disposed underneath the solder layer 82. When wet etching technique is used, the projections 69 may be trapezoidally shaped. Since the backside of the semiconductor chip 70 is exposed through the adhesive 74, heat generated by the chip 70 in operation can be easily removed.

Figure 16:
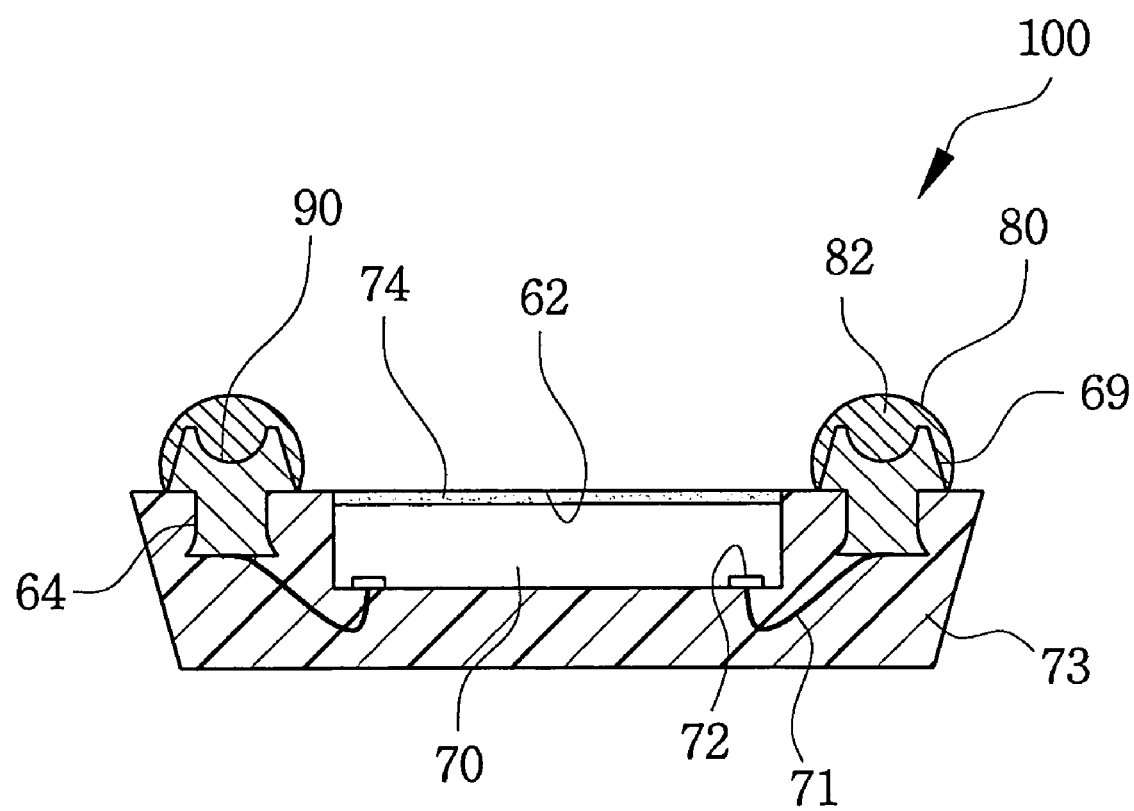

Finally, as shown in FIG. 16, a plurality of external terminals 80 are formed on and around the concave depressions 90 by reflowing the solder layer 82 on the projections 69 and thereby the manufacturing process of a BCC package 100 is finished. By solder reflowing, the solder layer 82 may entirely cover the projections 69 and may form hemispherical terminals 80 for external connection.

In a final structure of the BCC package 100, the interface between the solder-reflowed terminals 80 and the projections 69 increases in area, relative to conventional structures, because of the concave depressions 90 on the top of the projections 69. Therefore, the adhesive strength between the external terminals 80 and the projections 69 also increases. Ultimately, mounting of the BCC package 100 on a next-level circuit board through the external terminals 80 improves solder joint reliability.

While this invention has been particularly shown and described with reference to the embodiments above, it will be understood by those skilled in the art that various changes in form and details may be made therein without departing from the spirit and scope of the invention as defined by the appended claims.

We claim:

1. A method for manufacturing a semiconductor package, the method comprising:
   forming a lead frame including a first surface having a chip-attaching area, a second surface opposite the first surface, a plurality of internal terminals formed on the first surface, and a plurality of concave depressions formed on the second surface;
   attaching a semiconductor chip having a plurality of chip pads to the chip-attaching area of the lead frame; and
   electrically connecting the chip pads of the semiconductor chip and the internal terminals, through a plurality of bond wires.

2. The method of claim 1, further comprising forming a resin encapsulant on the first surface of the lead frame so as to at least partially cover the semiconductor chip, the bond wires, and the internal terminals.

3. The method of claim 2, further comprising forming a plurality of external terminals at least in part in the concave depressions of the lead frame by forming a solder layer over the concave depressions, removing the lead frame exposed outside the solder layer, and reflowing the solder layer.

4. The method of claim 1, wherein the forming of the lead frame includes:
   providing a base lead frame;
   forming a first photoresist pattern on a second surface of the base lead frame, the first photoresist pattern having a plurality of openings defining regions for the concave depressions;
   forming the concave depressions by etching regions exposed through the openings of the base lead frame;
   removing the first photoresist pattern;
   forming a second photoresist pattern on a first surface of the base lead frame, the second photoresist pattern covering regions for the internal terminals;
   forming the internal terminals by etching non-covered regions of the base lead frame; and
   removing the second photoresist pattern.

5. The method of claim 4, wherein the forming of the concave depressions is performed by wet etching.

6. The method of claim 4, wherein the forming of the concave depressions is performed by dry etching.

7. The method of claim 3, wherein the forming of the external terminals includes:
   forming a third photoresist pattern on the second surface of the lead frame, the third photoresist pattern having openings exposing the concave depressions;
   forming a solder layer over the concave depressions by filling the openings;
   removing the third photoresist pattern;
   removing the lead frame exposed outside the solder layer by using the solder layer as a mask, so that residual parts of the lead frame form projections having the concave depressions, wherein the projections are disposed underneath the solder layer; and
   forming the external terminals by reflowing the solder layer.

8. A semiconductor package comprising:
   a semiconductor chip having a plurality of chip pads;
   a plurality of lead frame terminals, each of the lead frame terminals having an internal terminal and a projection extending from the internal terminal, each of the internal terminals electrically connected with the chip pads, each of the projections having a concave depression;
   a plurality of external terminals formed of solder, the plurality of external terminals at least in part in the concave depressions of the projections.

9. The package of claim 8 further comprising, a plurality of bond wires coupled with the chip pads and the internal terminals.

10. The package of claim 9 further comprising, a resin encapsulant at least partially covering the semiconductor chip, the bond wires, and the internal terminals.

11. The package of claim 10, wherein the concave depressions have shapes including hemisphere, polyhedron, cruciform, or irregulars.

* * * * *